US012775217B2

(12) United States Patent
Lee et al.

(10) Patent No.: US 12,775,217 B2
(45) Date of Patent: Oct. 27, 2026

(54) MONITORING SYSTEM FOR MANUFACTURING SEMICONDUCTOR DEVICE AND MONITORING METHOD FOR MANUFACTURING THE SEMICONDUCTOR DEVICE USING THE SAME

(71) Applicant: Samsung Electronics Co., Ltd., Suwon-si (KR)

(72) Inventors: Dong-Hyub Lee, Suwon-si (KR); Jeong-Gil Kim, Suwon-si (KR); Hyuck Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 580 days.

(21) Appl. No.: 18/455,277

(22) Filed: Aug. 24, 2023

(65) Prior Publication Data

US 2024/0272559 A1 Aug. 15, 2024

(30) Foreign Application Priority Data

Feb. 7, 2023 (KR) ........................ 10-2023-0015996

(51) Int. Cl.
*G03F 7/00* (2006.01)
*H10P 74/20* (2026.01)

(52) U.S. Cl.
CPC ...... *G03F 7/70591* (2013.01); *G03F 7/70033* (2013.01); *H10P 74/203* (2026.01)

(58) Field of Classification Search
CPC ............. G03F 7/70591; G03F 7/70033; G03F 7/70133; G03F 7/70175; G03F 7/7085; H10P 74/203; G01M 11/005
(Continued)

(56) References Cited

U.S. PATENT DOCUMENTS 7,760,341 B2 7/2010 Bakshi et al.
7,960,701 B2 6/2011 Bowering et al.
(Continued)

FOREIGN PATENT DOCUMENTS

KR 10-2004-0076218 A 8/2004
KR 10-2019-0139943 A 12/2019
(Continued)

OTHER PUBLICATIONS

Korean Office Action dated Aug. 5, 2026 for corresponding Korean Patent Application No. 10-2023-0015996 and its English-language translation.

*Primary Examiner* — Caleen O Sullivan
(74) *Attorney, Agent, or Firm* — HARNESS, DICKEY & PIERCE, P.L.C.

(57) ABSTRACT

A monitoring system for manufacturing a semiconductor device comprises a source module, an optical module including a collector collecting and reflecting extreme ultraviolet generated light from the source module, an illumination optical system including a field facet mirror, and a projection optical system transferring the extreme ultraviolet light reflected from a reticle to a substrate. A calculating module calculates a degradation rate of the optical module, and a method comprises respectively generating a reference image profile and an (N)th image profile through the second sensor module by correcting the far field image of the extreme ultraviolet with respect to the intensity of the extreme ultraviolet at a reference time point and an (N)th time point after the reference time point, and calculating the degradation rate of the optical module by using a ratio of the reference image profile and the (N)th image profile by the calculation module.

20 Claims, 9 Drawing Sheets

(58) Field of Classification Search
USPC ............................................... 430/30; 355/67
See application file for complete search history.

(56) References Cited

U.S. PATENT DOCUMENTS

| | | | | |
|---|---|---|---|---|
| 8,173,984 | B2 | 5/2012 | Moriya et al. | |
| 8,314,398 | B2 | 11/2012 | Bowering et al. | |
| 8,686,370 | B2 | 4/2014 | Bowering et al. | |
| 10,747,119 | B2 | 8/2020 | Huang et al. | |
| 2016/0195816 | A1* | 7/2016 | Endres ................ | G03F 7/70075 355/71 |
| 2016/0202118 | A1* | 7/2016 | Ehrmann .............. | G01J 1/0407 250/252.1 |
| 2018/0019568 | A1* | 1/2018 | Kyono ................. | G02B 6/4244 |
| 2020/0249575 | A1* | 8/2020 | Baumer ................. | G01B 11/00 |
| 2021/0294222 | A1 | 9/2021 | Petri et al. | |

FOREIGN PATENT DOCUMENTS

| | | | |
|---|---|---|---|
| KR | 10-2021-0137391 | A | 11/2021 |
| KR | 10-2022-0110198 | A | 8/2022 |
| KR | 10-2022-0148830 | A | 11/2022 |

* cited by examiner

MONITORING SYSTEM FOR MANUFACTURING SEMICONDUCTOR DEVICE AND MONITORING METHOD FOR MANUFACTURING THE SEMICONDUCTOR DEVICE USING THE SAME

CROSS-REFERENCE TO RELATED APPLICATION

This application claims priority from Korean Patent Application No. 10-2023-0015996 filed on Feb. 7, 2023 in the Korean Intellectual Property Office and all the benefits accruing therefrom under 35 U.S.C. 119, the contents of which in its entirety are herein incorporated by reference.

BACKGROUND

Various example embodiments relate to a system for manufacturing a semiconductor device and a method for manufacturing the semiconductor device using the same.

In more detail, various example embodiments relate to a system for manufacturing a semiconductor device, which includes an extreme ultraviolet exposure apparatus using a laser produced plasma (LPP) method by laser irradiation, and a method for manufacturing a semiconductor device using the same.

As a design rule of a semiconductor device is gradually reduced, a technology for forming smaller sized patterns is required or desired. To meet or to at least partially satisfy these expectations, an extreme ultraviolet exposure process using extreme ultraviolet (EUV) having a short wavelength as a light source may be used. In particular, extreme ultraviolet having a wavelength of about 10 nm to about 14 nm may be used in a mass production process of a nano-grade semiconductor device of 40 nm or less.

A scheme for generating a light source plasma for generating extreme ultraviolet includes a light source Laser Produced Plasma (LPP) scheme by laser irradiation, and a light source Discharge Produced Plasma (DPP) scheme by gas discharge, which is driven by a pulse power technology. The light source laser produced plasma (LPP) scheme by laser irradiation may generate EUV light from plasma generated by irradiating laser to a target material.

In this case, debris such as fine particles that have not been plasma from the target material and strong intensity of extreme ultraviolet may cause deterioration of operational efficiency such as reflectivity and/or transmittance of an optical element.

SUMMARY

Various example embodiments may provide a system for manufacturing a semiconductor device to more exactly monitor and accommodate for reflectivity or a degradation rate of an optical device.

Alternatively or additionally, various example embodiments may provide a method for manufacturing a semiconductor device to more exactly monitor and accommodate reflectivity and/or a degradation rate of an optical device.

Various features of example embodiments are not limited to those mentioned above and additional objects, which are not mentioned herein, will be clearly understood by those of ordinary skill in the art in the art from the following description of the present disclosure.

A method for manufacturing a semiconductor device according to some embodiments to at least partially achieve the objects uses a monitoring system for manufacturing a semiconductor device, wherein the monitoring system includes a source module configured to generate extreme ultraviolet light, an optical module configured to transmit a pattern to a substrate by using the extreme ultraviolet light, the optical module including a collector configured to collect and reflect the extreme ultraviolet light generated from the source module, an illumination optical system including a field facet mirror configured to condense the reflected extreme ultraviolet light and a pupil facet mirror configured to transfer the extreme ultraviolet light transferred from the field facet mirror to a reticle, and a projection optical system configured to transfer the extreme ultraviolet light reflected from the reticle to the substrate, a first sensor module configured to measure a far field image of the extreme ultraviolet light from the optical module, a second sensor module adjacent to the substrate, configured to measure intensity of the extreme ultraviolet light, and a calculation module configured to calculate a degradation rate of the optical module. The method comprises respectively generating a reference image profile and an (N)th image profile through the second sensor module by correcting the far field image of the extreme ultraviolet light with respect to the intensity of the extreme ultraviolet light at a reference time point and an (N)th time point after the reference time point, and calculating the degradation rate of the optical module by using a ratio of the reference image profile to the (N)th image profile by the calculation module.

Alternatively or additionally a method for manufacturing a semiconductor device according to some example embodiments to at least partially achieve some objects uses a monitoring system for manufacturing a semiconductor device, the monitoring system comprising a source module configured to generate extreme ultraviolet light, an optical module configured to transfer a pattern to a substrate by using the extreme ultraviolet light, the optical module including a collector configured to collect and reflect the extreme ultraviolet light generated from the source module, an illumination optical system including a field facet mirror configured to condense the reflected extreme ultraviolet light and a pupil facet mirror configured to transfer the extreme ultraviolet light transferred from the field facet mirror to a reticle, and a projection optical system configured to transfer the extreme ultraviolet light reflected from the reticle to the substrate, a first sensor module configured to measure a far field image of the extreme ultraviolet light from the optical module, a second sensor module adjacent to the source module, and configured to measure an intensity of the extreme ultraviolet light, a third sensor module adjacent to the substrate, configured to measure the intensity of the extreme ultraviolet light, a calculation module configured to calculate a degradation rate of the optical module, and a fourth sensor module adjacent to the reticle, configured to measure the intensity of the extreme ultraviolet light incident on the reticle in the form of a slit, and comprises respectively generating a reference image profile and an (N)th image profile through the second sensor module by correcting the far field image of the extreme ultraviolet light with respect to the intensity of the extreme ultraviolet light at a reference time point and an (N)th time point after the reference time point, and calculating the degradation rate of the optical module by using a ratio of the reference image profile to the (N)th image profile by the calculation module.

A method for manufacturing a semiconductor device according to some example embodiments to at least partially achieve some of the objects uses a monitoring system for manufacturing a semiconductor device, the monitoring system comprising a source module configured to generate extreme ultraviolet light, an optical module configured to transfer a pattern to a substrate by using the extreme ultraviolet light, the optical module including a collector configured to collect and reflect the extreme ultraviolet light generated from the source module, an illumination optical system including a field facet mirror configured to condense the reflected extreme ultraviolet light and a pupil facet mirror configured to transfer the extreme ultraviolet light transferred from the field facet mirror to a reticle, and a projection optical system configured to transfer the extreme ultraviolet light reflected from the reticle to the substrate, a first sensor module configured to measure a far field image of the extreme ultraviolet light from the optical module, a second sensor module adjacent to the source module, configured to measure an intensity of the extreme ultraviolet light, a third sensor module disposed to be adjacent to the substrate, configured to measure the intensity of the extreme ultraviolet light, and a calculation module configured to calculate a degradation rate of the optical module, and comprises respectively generating a reference image profile and an (N)th image profile through the second sensor module by correcting the far field image of the extreme ultraviolet light with respect to the intensity of the extreme ultraviolet light at a reference time point and an (N)th time point after the reference time point, and respectively calculating a degradation rate of the field facet mirror and a sum of degradation rates of the other optical modules except the field facet mirror by using a ratio based on the reference image profile and the (N)th image profile by the calculation module.

Details of various example embodiments are included in the detailed description and drawings.

BRIEF DESCRIPTION OF THE DRAWINGS

The above and other aspects and features of various example embodiments will become more apparent by describing in detail exemplary embodiments thereof with reference to the attached drawings, in which.

DETAILED DESCRIPTION

Hereinafter, a system for manufacturing a semiconductor device according to some examples embodiments will be described with reference to FIGS. 1 to 8.

Figure 1:
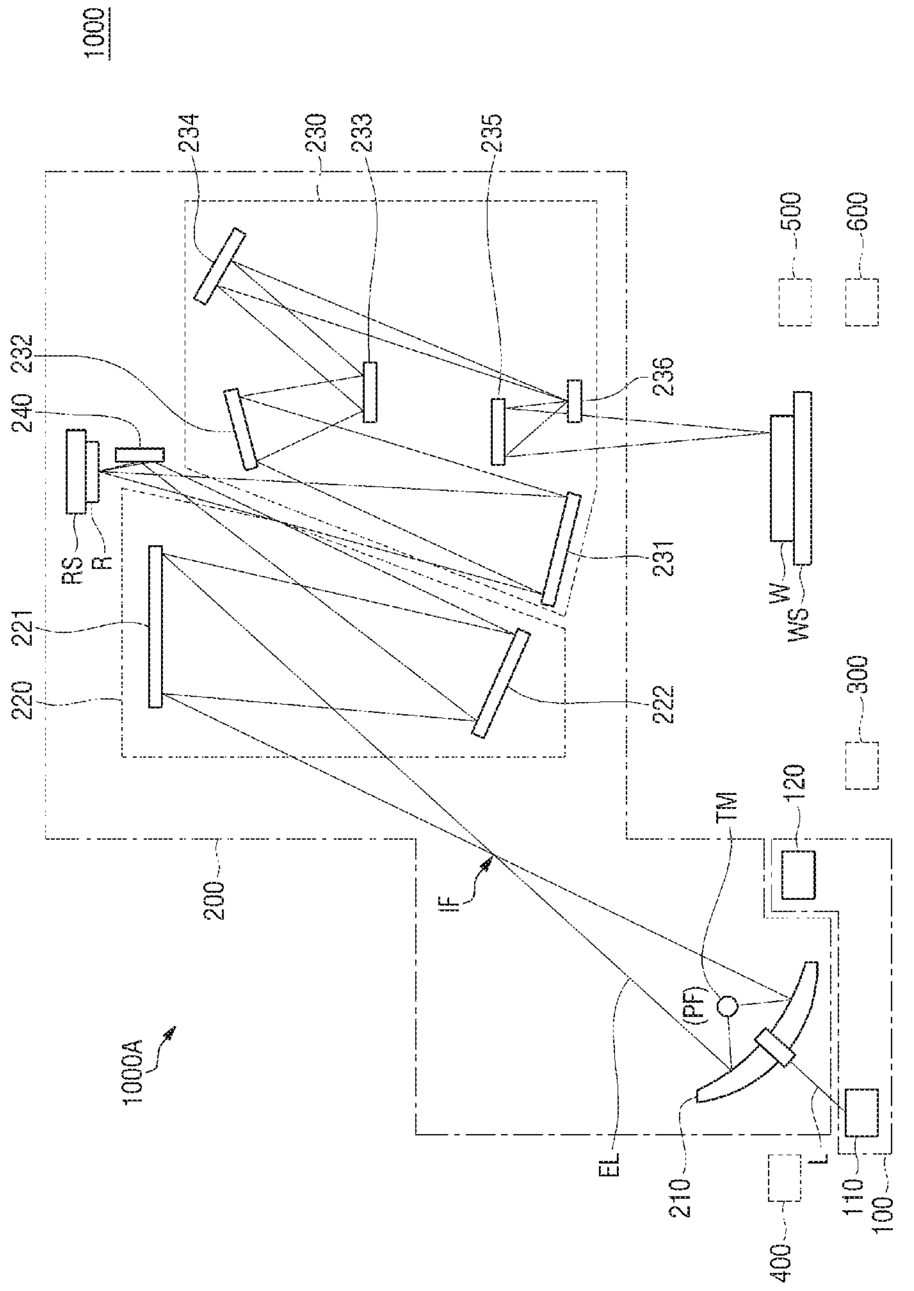
FIG. 1 is a schematic view illustrating a monitoring system for manufacturing a semiconductor device according to some example embodiments.
Figure 2:
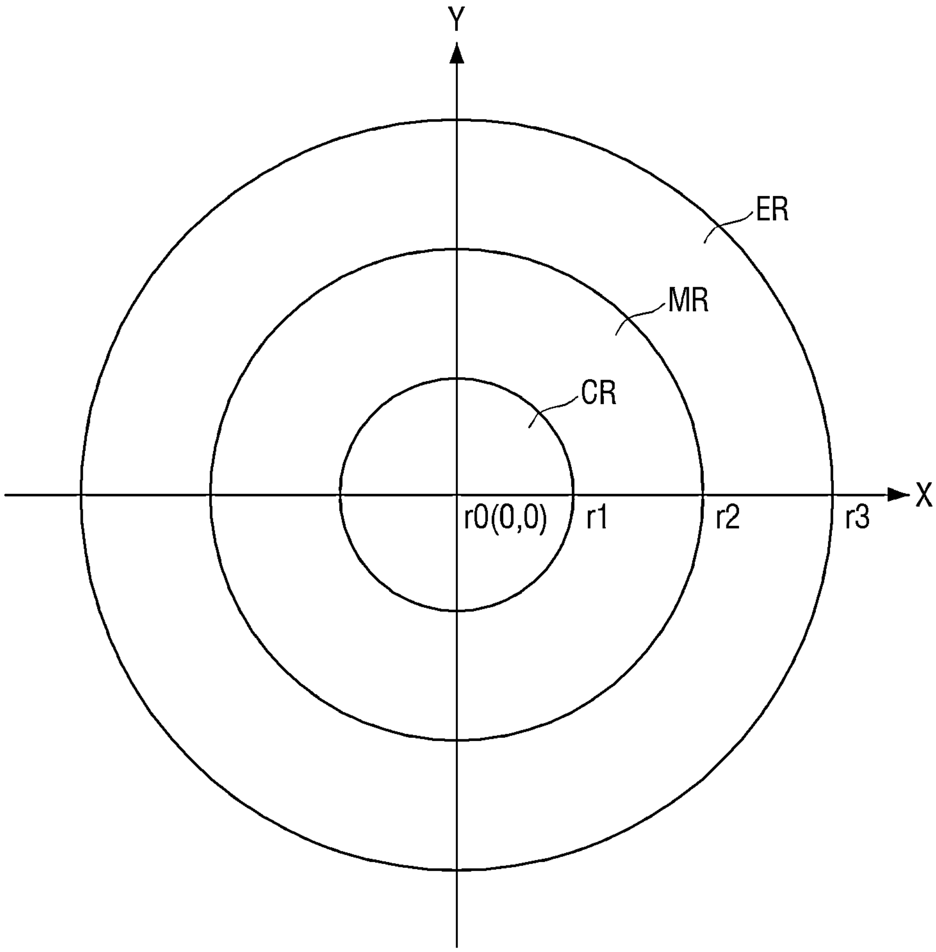
FIG. 2 is a schematic view illustrating a far field image of extreme ultraviolet light reflected from an optical module according to some example embodiments.
Figure 3:
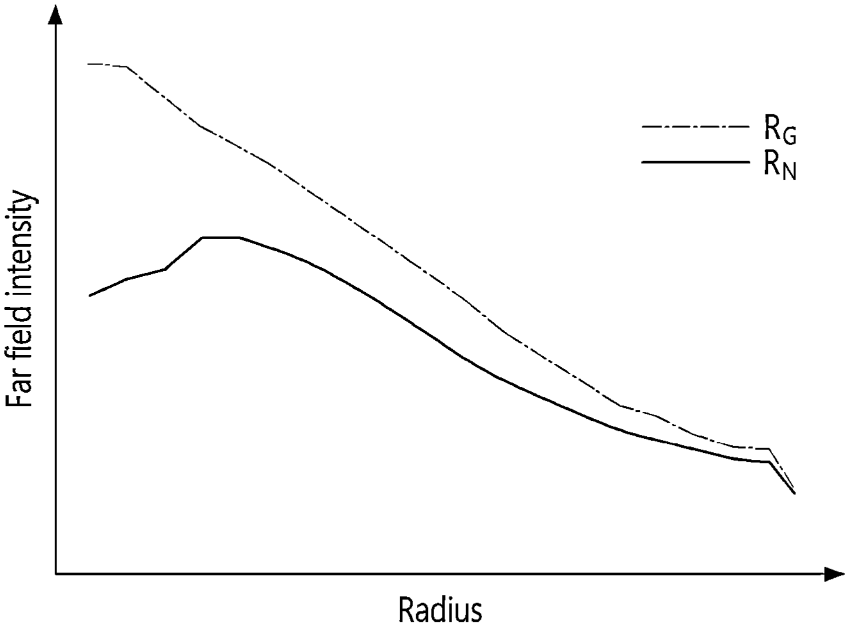
FIG. 3 is a schematic view illustrating an image file in which the far field image of the extreme ultraviolet light of FIG. 2 is corrected with respect to the intensity of the extreme ultraviolet light.
Figure 4:
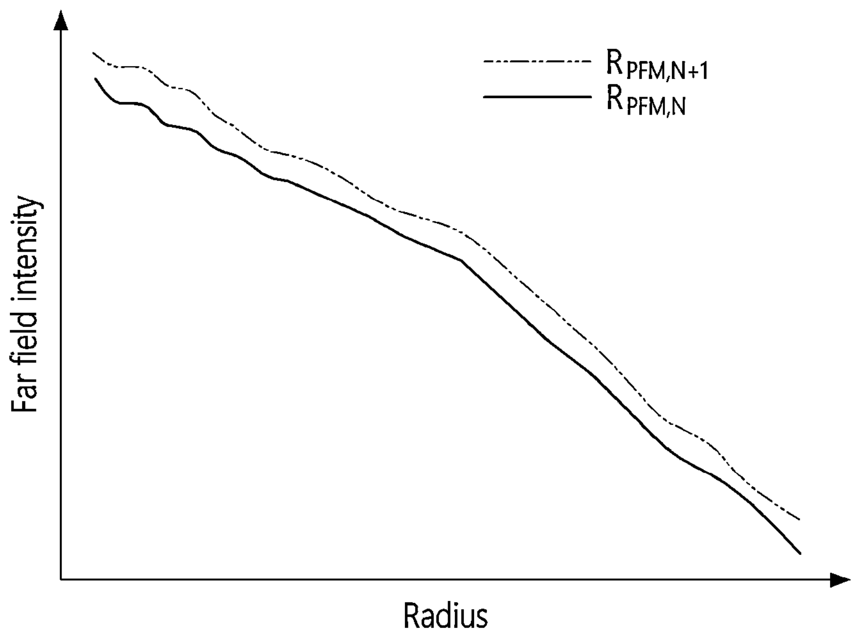
FIG. 4 is a schematic view illustrating an image file in which a far field image of extreme ultraviolet light according to some example embodiments is corrected with respect to the intensity of the extreme ultraviolet light.
Figure 5:
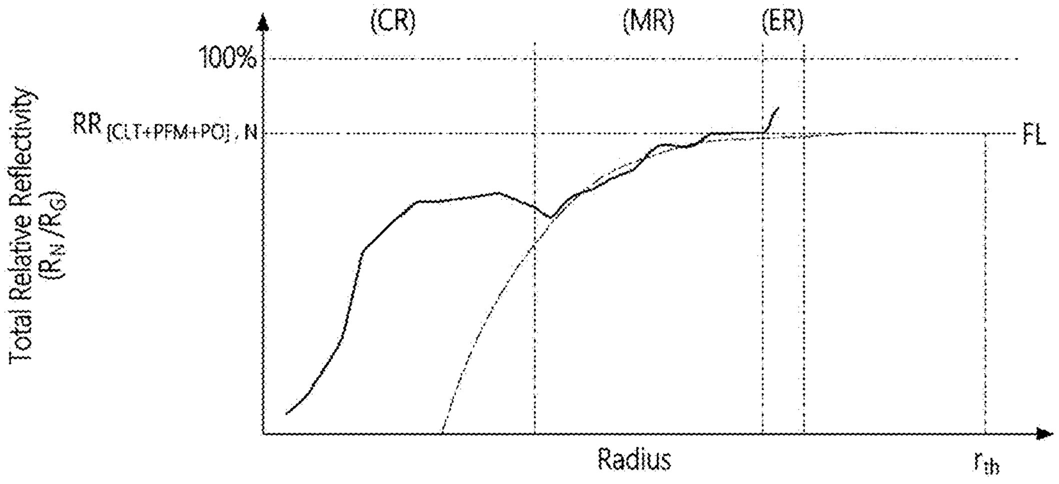
FIG. 5 is a schematic view illustrating a degradation rate of an optical module according to some example embodiments.
Figure 6:
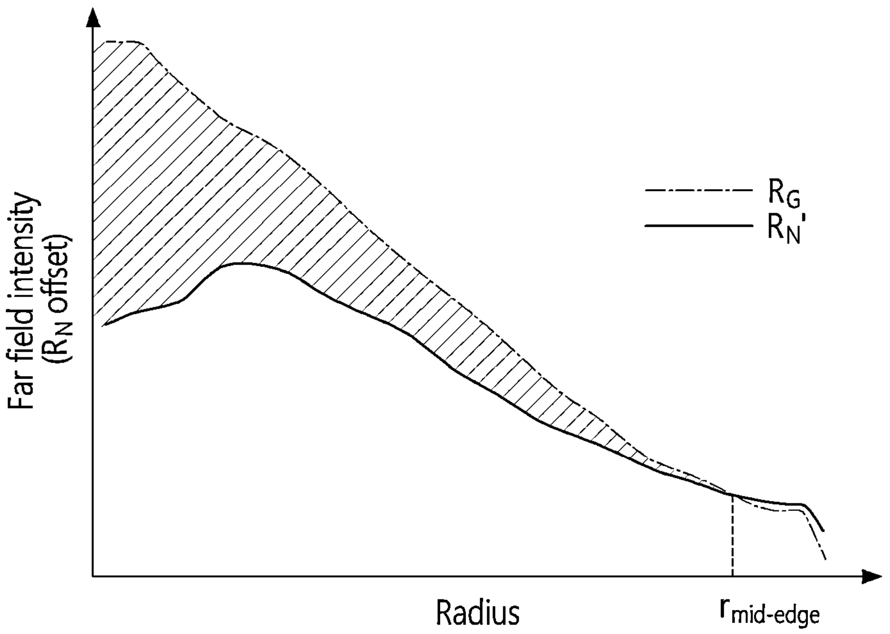
FIG. 6 is a schematic view illustrating an image file in which a far field image of extreme ultraviolet light according to some example embodiments is corrected with respect to the intensity of the extreme ultraviolet light.

FIG. 1 is a schematic view illustrating a system for manufacturing a semiconductor device according to some example embodiments. FIG. 2 is a schematic view illustrating a far field image of extreme ultraviolet light reflected from an optical module according to some example embodiments. FIG. 3 is a schematic view illustrating an image file in which the far field image of the extreme ultraviolet light of FIG. 2 is corrected with respect to the intensity of the extreme ultraviolet light. FIG. 4 is a schematic view illustrating an image file in which a far field image of extreme ultraviolet light according to some example embodiments is corrected with respect to the intensity of the extreme ultraviolet light. FIG. 5 is a schematic view illustrating a degradation rate of an optical module according to some example embodiments. FIG. 6 is a schematic view illustrating an image file in which a far field image of extreme ultraviolet light according to some example embodiments is corrected with respect to the intensity of the extreme ultraviolet light.

Referring to FIG. 1, a monitoring system 1000 for manufacturing a semiconductor device according to some example embodiments may include an extreme ultraviolet light exposure apparatus 1000A, a first sensor module 300, a second sensor module 400, a third sensor module 500 and a calculation module 600. The extreme ultraviolet light exposure apparatus 1000A may include a source module 100, an optical module 200, a reticle stage RS and a substrate stage WS. In some example embodiments, the monitoring system 1000 for manufacturing a semiconductor device may be or may include or be included in a device for manufacturing a semiconductor device.

The source module 100 may generate extreme ultraviolet light EL from laser L. The source module 100 may include a laser generator 110 and a droplet supplier 120.

Although not shown in detail, a chamber may provide a space in which plasma is generated to generate the extreme ultraviolet light EL that will be described later. In some example embodiments, the inside of the chamber may be provided in vacuum (e.g., about 1 Torr or less). The inside of the chamber provided in vacuum may facilitate the progress of the laser L and/or the extreme ultraviolet light EL.

The laser generator 110 may generate laser L and may irradiate the laser L into the chamber. The laser L generated from the laser generator 110 may be irradiated toward a first focus PF of a collector 210 that will be described later. The collector 210 may be or may have a long axis ellipsoid of a concavely converged shape. The laser L may be, for example, CO2 laser beam or neodymium-doped yttrium aluminum garnet (Nd YAG) laser beam, but is not limited thereto.

The droplet supplier 120 may supply a source droplet TM as a target material for generating extreme ultraviolet light EL. For example, the droplet supplier 120 may supply the source droplet TM into the chamber by using a droplet supply nozzle installed in the chamber. The droplet supply nozzle may provide the source droplet TM into the chamber at a period (such as a dynamically determined, or, alternatively, a predetermined period). The source droplet TM provided into the chamber may be irradiated by the laser L generated from the laser generator 110 to generate plasma.

The source droplet TM may include at least one extreme ultraviolet light emitting element, for example, one or more of tin (Sn), xenon (Xe), lithium (Li), titanium (Ti) or the like, which is irradiated by the laser L to have an emission line of a wavelength in the range of extreme ultraviolet radiation. The extreme ultraviolet light emitting element may be in the form of droplets and/or solid particles contained in the droplets.

In some example embodiments, the source droplet TM may include tin (Sn). For example, the source droplet TM may include pure tin, a tin compound, a tin alloy or their combination. The tin compound may include at least one of, for example, SnBr4, SnBr2 or SnH, but is not limited thereto. The tin alloy may include at least one of, for example, Sn—Ga, Sn—In or Sn—In—Ga, but is not limited thereto.

The optical module 200 may include optical elements for transferring a pattern to a substrate W by using the extreme ultraviolet light EL. The optical module 200 may include a collector 210, an illumination optical system 220 and a projection optical system 230, and may further include a relay mirror 240.

The collector 210 may be disposed within the chamber. The collector 210 may have a first focus PF and a second focus IF. For example, the collector 210 may include a prolate ellipsoid-shaped curved surface having a first focus PF and a second focus IF farther than the first focus PF.

The collector 210 may collect and reflect the extreme ultraviolet light EL generated from the source module 100. The collector 210 may selectively collect and reflect extreme ultraviolet light EL having a wavelength in the range of extreme ultraviolet light among light of various wavelengths radiated from plasma generated from the source droplet TM. The extreme ultraviolet light EL may have a wavelength between about 1 nm and about 31 nm. For example, the extreme ultraviolet light EL may have a wavelength between about 10 nm and about 14 nm.

The extreme ultraviolet light EL generated at the first focus PF may be reflected by the collector 210 toward the second focus IF. For example, the extreme ultraviolet light EL may be emitted by being concentrated on the second focus IF by the collector 210.

In some example embodiments, the collector 210 may include a multi-layer mirror that provides an elliptical reflective surface. The multi-layer mirror may include a structure in which a plurality of films selected from among molybdenum (Mo), silicon (Si), silicon carbide (SiC), boron carbide (B4C), molybdenum carbide (Mo2C) and silicon nitride (Si3N4) are alternately stacked one by one, but is not limited thereto.

The extreme ultraviolet light EL generated from the extreme ultraviolet light exposure apparatus 1000A may be irradiated to the illumination optical system 220.

The illumination optical system 220 may include a Field Facet Mirror (FFM) 221 and a Pupil Facet Mirror (PFM) 222. The field facet mirror 221 may condense the reflected extreme ultraviolet light. The pupil facet mirror 222 may transfer the extreme ultraviolet light, which is transferred from the field facet mirror 221, to a reticle R. The illumination optical system 220 may control an intensity distribution of the extreme ultraviolet light EL to be improved or optimized for the manufacture of the semiconductor device. The illumination optical system 220 may include a concave mirror, a convex mirror or their combination so as to diversify a path of the extreme ultraviolet light EL.

Although FIG. 1 shows that the illumination optical system 220 includes only two mirrors, this is only an example, and various modifications may be made in the number and arrangement of mirrors included in the illumination optical system 220. The illumination optical system 220 may include an independent vacuum chamber, and may further include various lenses and optical elements, which are not shown in FIG. 1.

The relay mirror 240 may be used to direct the extreme ultraviolet light EL from illumination optical system 220 onto the reticle R.

The reticle R may be mounted on the reticle stage RS. The reticle stage RS may move the reticle R in a horizontal direction to control a position of the reticle R. For example, the reticle stage RS may move in the horizontal direction and/or a rotational direction by using an electrostatic chuck in a state that the reticle R is mounted thereon. The reticle R may be mounted on the bottom surface of the reticle stage RS such that a surface on which optical patterns are formed is directed downward.

Although not shown in detail, a slit through which the extreme ultraviolet light EL passes may be disposed below the reticle stage RS. The slit may form a shape of the extreme ultraviolet light EL transferred from the illumination optical system 220 to the reticle R mounted on the reticle stage RS. The extreme ultraviolet light EL transferred from the illumination optical system 220 may be irradiated onto the surface of the reticle R by passing through the slit.

The extreme ultraviolet light EL reflected from the reticle R that is mounted on the reticle stage RS may be transferred to the projection optical system 230 by passing through the slit. The projection optical system 230 may receive the extreme ultraviolet light EL passing through the slit and transfer the extreme ultraviolet light EL to the substrate W. The projection optical system 230 may include a plurality of optical elements 231 to 236. The plurality of optical elements 231 to 236 may correct various aberrations.

Although FIG. 1 shows that the plurality of optical elements 231 to 236 include only six concave mirrors, this is only an example, and various modifications may be made in the number and/or the arrangement of mirrors included in the plurality of optical elements 231 to 236.

The substrate W may be mounted on the substrate stage WS. The substrate stage WS may move the substrate W in the horizontal direction to control the position of the substrate W. For example, the substrate stage WS may move in the horizontal direction by using an electrostatic chuck in a state that the substrate W is mounted thereon. Therefore, the projection optical system 230 may reduce and project the patterns formed on the reticle R onto the substrate W.

The substrate W may be used to manufacture the semiconductor device. The semiconductor device may include, for example, a semiconductor element such as one or more of silicon (Si) and germanium (Ge) or a compound semiconductor such as silicon carbide (SiC), gallium arsenide (GaAs), indium arsenide (InAs) and indium phosphide (InP). In some example embodiments, the semiconductor device may include a conductive region, for example, a well doped with impurities or a structure doped with impurities. In some example embodiments, the semiconductor device may include various device isolation structures such as shallow trench isolation (STI). In some example embodiments, the semiconductor device may have a silicon on insulator (SOI) structure. For example, the semiconductor device may include a buried oxide layer (BOX). In some example embodiments, a shape of the substrate W may be circular; however, example embodiments are not limited thereto. In some example embodiments, the substrate W may be a wafer; however, example embodiments are not limited thereto.

The first sensor module 300 may measure the far field image of the extreme ultraviolet light EL reflected from the optical module 200. Meanwhile, the position of the first sensor module 300 shown in FIG. 1 is an example, and the position of the first sensor module 300 is not limited to that shown in FIG. 1.

Referring to FIG. 2, the far field image of the extreme ultraviolet light EL may be formed to have a spatial distribution in radial directions r0 to r3.

The far field image of the extreme ultraviolet light EL may be a circular image extending in the X-axis and Y-axis directions that are perpendicular to each other. The far field image of the extreme ultraviolet light EL may have a center region CR, a middle region MR surrounding the center region CR, and an edge region ER surrounding the center region CR and the middle region MR, based on r0 having coordinates of (0,0). Each radius (each of r1 to r3) may be increased toward the edge region ER from the center region CR.

The second sensor module 400 may be disposed to be adjacent to the source module 100, and may measure the intensity of the extreme ultraviolet light EL. The second sensor module 400 may be disposed to be adjacent to one end of the source module 100. The position of the second sensor module 400 shown in FIG. 1 is an example, and is not limited to that shown in FIG. 1.

The third sensor module 500 may be disposed to be adjacent to the substrate W, and may measure the intensity of the extreme ultraviolet light EL. The third sensor module 500 may be disposed to be adjacent to one end of the substrate W. The position of the third sensor module 500 shown in FIG. 1 is an example, and is not limited to that shown in FIG. 1.

The far field image of the extreme ultraviolet light EL may be corrected by the second sensor module 400 and/or the third sensor module 500 with respect to the intensity of the extreme ultraviolet light EL to obtain a reference image profile RG and an (N)th image profile RN, respectively.

The calculation module 600 may calculate a degradation rate of the optical module 200.

Reflectivity REFLECTSCN of the optical module 200 may be calculated by the calculation module 600 as expressed in Equation 1 by using a ratio between the intensity (EUV Power at Source Vessel) of the extreme ultraviolet light EL, which is measured by the second sensor module 400, and the intensity (EUV Power at Wafer Level) of the extreme ultraviolet light EL, which is measured by the third sensor module 500.

$$\text{REFLECT}_{SCN} = \frac{EUV\text{ Power at Wafer Level}}{EUV\text{ Power at Source Vessel}} \quad \text{Equation 1}$$

The reflectivity REFLECTSCN of the Equation 1 indicates an entire reflectivity of the optical module 200 including the collector 210, and does not necessarily indicate absolute reflectivity.

In general, the collector 210 may have a fast degradation tendency due to debris generated from droplets such as from tin droplets. However, as described below, the entire reflectivity of the optical module 200, which reduces or minimizes influence of the collector 210 due to tin contamination, may be obtained using reflectivity REFLECTSCN,N of the optical system 200 after the collector 210 is replaced several times as compared with reflectivity REFLECTSCN,0 of the optical system 200 at the time when the extreme ultraviolet light exposure apparatus 1000A is initially installed.

Therefore, the relative reflectivity (RR) RRSCN,N of the optical module 200 may be calculated by the calculation module 600, as expressed in Equation 2, by using a ratio between reflectivity REFLECTSCN,0 of the optical system 200 at the time when the extreme ultraviolet light exposure apparatus 1000A is initially installed and reflectivity REFLECTSCN,N of the optical system 200 immediately after the (N)th replacement of the collector 210.

$$RR_{SCN,N} = \frac{\text{REFLECT}_{SCN,N}}{\text{REFLECT}_{SCN,0}} \quad \text{Equation 2}$$

Referring to FIG. 3, the far field image of the extreme ultraviolet light EL may be corrected by a parameter related to the intensity of the extreme ultraviolet light EL at a reference time point and an (N)th time point after the reference time point, so that a reference image profile RG and an (N)th image profile RN may be acquired, respectively.

In some example embodiments, the reference time point may refer to the initial installation time point (e.g., to the setup time point) of the aforementioned extreme ultraviolet light exposure apparatus 1000A, and the (N)th time point may refer to a time point immediately after the (N)th replacement of the aforementioned collector 210. In this case, N may be an integer of 0 or more. For example, when N is 0, the reference time may refer to a setup time point; when N is 1, the reference time may refer to a time point immediately after the first replacement of the collector 210. Also, in some example embodiments, the degradation rate may indicate a deterioration in the relative reflectivity.

In some example embodiments, the degradation rate may be calculated for each component constituting the optical module 200 as described below. Therefore, a degraded component of the optical module 200 may be more accurately specified, and a degradation cause may be more precisely analyzed and/or accommodated.

Referring to FIG. 3, each of the reference image profile RG and the (N)th image profile RN may indicate that the far field image of the extreme ultraviolet light EL is corrected (normalized) by the parameter related to the intensity of the extreme ultraviolet light EL at the reference time point and the (N)th time point, respectively. A change in the far field intensity for a radius of the far field image of the extreme ultraviolet light EL may be known by the reference image profile RG and the (N)th image profile RN.

Referring to FIGS. 2 and 3, as the radius of the far field image of the extreme ultraviolet light EL is increased, for example, as the center region CR is directed toward the edge region ER, the intensity (e.g., EUV light amount) of the extreme ultraviolet light EL may be gradually reduced. This may be interpreted because the intensity of the extreme ultraviolet light EL tends to be more concentrated on the center region CR without being uniformly dispersed throughout the entire region.

Meanwhile, the reference image profile RG may refer to an image profile in a state that there is no deterioration in the reflectivity of the optical module 200 immediately after setup of the extreme ultraviolet light exposure device 1000A. The (N)th image profile RN may indicate an image profile immediately after the (N)th replacement of the collector 210, for example, in a state that there is almost no tin contamination.

Referring to FIG. 3, the intensity of the extreme ultraviolet light EL may be small in a case of the (N)th image profile RN as compared with the reference image profile RG. This may be because that degradation of the optical module 200 occurs until the (N)th replacement of the collector 210. Alternatively or additionally, when the state of the washed collector 210 immediately after the replacement is not sufficiently clean from the beginning due to insufficient washing and/or the like, this may be interpreted that the reflectivity is generally deteriorated as compared with the collector 210 during setup.

Also, referring to FIG. 3, in case of the (N)th image profile RN compared with the reference image profile RG, the amount of intensity reduction (for example, a slope of the intensity) of the extreme ultraviolet light EL is small as the radius of the far field image of the extreme ultraviolet light EL is increased. This may be because that degradation of the field facet mirror 221 mainly occurs in a region corresponding to the center region CR of the far field image of the extreme ultraviolet light EL due to the strong extreme ultraviolet light EL. For example, a reduction (or a degradation rate) of the reflectivity of the field facet mirror 221 is increased toward the region corresponding to the center region CR of the field facet mirror 221.

Referring to FIG. 4, a (PFM,N)th image profile RPFM,N represents a far field image profile of the extreme ultraviolet light EL before the replacement of the pupil facet mirror 222, and a (PFM,N+1)th image profile RPFM,N+1 represents a far field image profile of the extreme ultraviolet light EL after (or immediately after) the replacement of the pupil facet mirror 222. The profile of FIG. 4 represents a far field image profile of the extreme ultraviolet light EL before and after the replacement of the pupil facet mirror 222 in a state that the other optical module 200 other than the pupil facet mirror 222 is remained as it is.

Referring to FIG. 4, the entire intensity of the extreme ultraviolet light EL after the replacement of the pupil facet mirror 222 is more increased than before the replacement of the pupil facet mirror 222, but there is little change in the image profile (or the slope) before and after the replacement of the pupil facet mirror 222. For example, the pupil facet mirror 222 is degraded at a faster rate than the field facet mirror 221, so that the degradation reaches a saturation state within a short period of time, whereby the assumption that the pupil facet mirror 222 hardly affects the change in the image profile may be derived.

When the state of the collector 210 immediately after the replacement of the collector 210 is not sufficiently clean as described above (for example, when tin contamination is not properly washed), the collector 210 may affect the far field image profile of the extreme ultraviolet light EL. Particle, such as tin contamination, mainly occurs in the center region CR and the edge region ER, and generally may not remain in the middle region MR after the collector 210 is washed. For example, referring to FIGS. 2 and 3 together, the weak intensity of the extreme ultraviolet light EL of the (N)th image profile RN in the center region CR may be interpreted as that the tin contamination partially remains in the center region CR even after the replacement of the collector 210.

Referring now to FIG. 5, the ratio of the (N)th image profile RN to the reference image profile RG, for example, the relative reflectivity RN/RG of the entire optical module 200 may be known. In this case, in order to exclude the influence of tin contamination of the collector 210 as much as possible, data related to the relative reflectivity RN/RG of the entire optical module 200 of the middle region MR may be extended to set a fitting line FL. When the collector 210 is replaced with a sufficiently washed collector 210 or a new collector 210, the fitting line FL may be set by using data of the entire region of the far field image.

As described above, the intensity of the extreme ultraviolet light EL may be reduced as a distance from the center region CR of the far field image of the extreme ultraviolet light EL is increased. Alternatively or additionally, since other components other than the field facet mirror 221 in the optical module 200 may hardly affect the image profile, the degradation rate of the entire optical module 200 may be predicted to converge to a particular value at a sufficiently large limit radius rth or greater.

Therefore, by the calculation module 600, the limit radius rth in which the degradation of the field facet mirror 221 does not occur may be predicted using the fitting line FL, and a convergence value RR[CLT+PFM+PO],N of the degradation rate of the optical module 200 at the limit radius rth may be extrapolated.

As a result, the degradation rate RRFFM,N of the field facet mirror 221 may be calculated by the calculation module 600, as expressed in Equation 3, by using the relative reflectivity RRSCN,N of the optical module 200, which is calculated by the Equation 2.

$$RR_{FFM,N} = \frac{RR_{SCN,N}}{RR_{[CLT+PFM+PO],N}} \quad \text{Equation 3}$$

For example, the degradation rate RRFFM,N of the field facet mirror 221 at the (N)th time point and a sum RR[CLT+PFM+PO],N of degradation rates of the collector 210, the pupil facet mirror 222 and the projection optical system 230 at the (N)th time point may be calculated separately.

In more detail, the relative reflectivity RRFFM,N of the field facet mirror 221 immediately after the (N)th replacement of the collector 210 compared with the initial installation of the extreme ultraviolet light exposure apparatus 1000A and the sum RR[CLT+PFM+PO],N of the relative reflectivity of the other optical module 200 other than the field facet mirror 221 immediately after the (N)th replacement of the collector 210 compared with the initial installation of the extreme ultraviolet light exposure apparatus 1000A may be calculated separately.

FIG. 6 schematically illustrates an (N')th image profile RN' obtained by offset-correcting the (N)th image profile RN of FIG. 3 so as to coincide with the reference image profile RG in the edge region ER.

The (N')th image profile RN' is an image profile obtained by offset-correcting the (N)th image profile RN based on a middle-edge region rmid-edge between the middle region MR and the edge region ER, which has almost no influence of tin contamination.

For example, a relation between the (N')th image profile RN' and the (N)th image profile RN may be defined as expressed in Equation 4 by using a variable aN that offset-corrects contamination that does not affect the image profile.

$$R'_N = a_N R_N \quad \text{Equation 4}$$

$$a_N = \frac{R_G(r_{mid-edge})}{R_N(r_{mid-edge})} \quad \text{Equation 5}$$

Referring to the Equation 5, the variable aN may be defined as a ratio between the reference image profile RG in the middle-edge region rmid-edge and the (N)th image profile RN in the middle-edge region rmid-edge.

In this case, a hatched region of FIG. 6, which corresponds to a difference between the reference image profile RG and the (N')th image profile RN', may mean the degradation rates of the field facet mirror 221 and the collector 210.

Therefore, a sum RR[CLT+FFM],N of the degradation rates of the collector 210 and the field mirror 221 may be calculated by the calculation module 600 by using a ratio of an area of the (N')th image profile RN' to an area of the reference image profile RG.

For example, as expressed in Equation 6, the relative reflectivity RR[CLT+FFM],N of the field facet mirror 221 and the collector 210 immediately after the (N)th replacement of the collector 210 compared with the initial installation of the extreme ultraviolet light exposure apparatus 1000A may be calculated by the calculation module 600.

$$RR_{[CLT+FFM],N} = \frac{\int 2\pi\gamma R'_N(\gamma)dr}{\int 2\pi\gamma R_G(\gamma)dr} = \frac{\int \gamma R'_N(\gamma)dr}{\int \gamma R_G(\gamma)dr} \quad \text{Equation 6}$$

Subsequently, the degradation rate RRCLT,N of the collector 210 may be calculated by the calculation module 600 through the degradation rate RRFFM,N of the field facet mirror 221, which is calculated by the Equation 3.

For example, the relative reflectivity RRCLT,N of the collector 210 immediately after the (N)th replacement of the collector 210 compared with the initial installation of the extreme ultraviolet light exposure apparatus 1000A may be calculated by the calculation module 600 as expressed in Equation 7.

$$RR_{CLT,N} = \frac{RR_{[CLT+FFM],N}}{RR_{FFM,N}} \quad \text{Equation 7}$$

Therefore, the sum RR[PFM+PO],N of the degradation rates of the pupil facet mirror 222 and the projection optical system 230 may be calculated by the calculation module 600 through the already calculated sum RR[CLT+PFM+PO],N of the degradation rates of the collector 210, the pupil facet mirror 221 and the projection optical system 230.

For example, the relative reflectivity RR[PFM+PO],N of the pupil facet mirror 222 and the projection optical system 230 immediately after the (N)th replacement of the collector 210 compared with the initial installation of the extreme ultraviolet light exposure apparatus 1000A may be calculated by the calculated module 600 as expressed in Equation 8.

$$RR_{[PFM+PO],N} = \frac{RR_{[CLT+PFM+PO],N}}{RR_{CLT,N}} \quad \text{Equation 8}$$

The degradation rate of the field facet mirror 221 in the optical module 200 and the degradation rate of the collector 210 may be separately calculated by a series of calculation processes described above.

Figure 7:
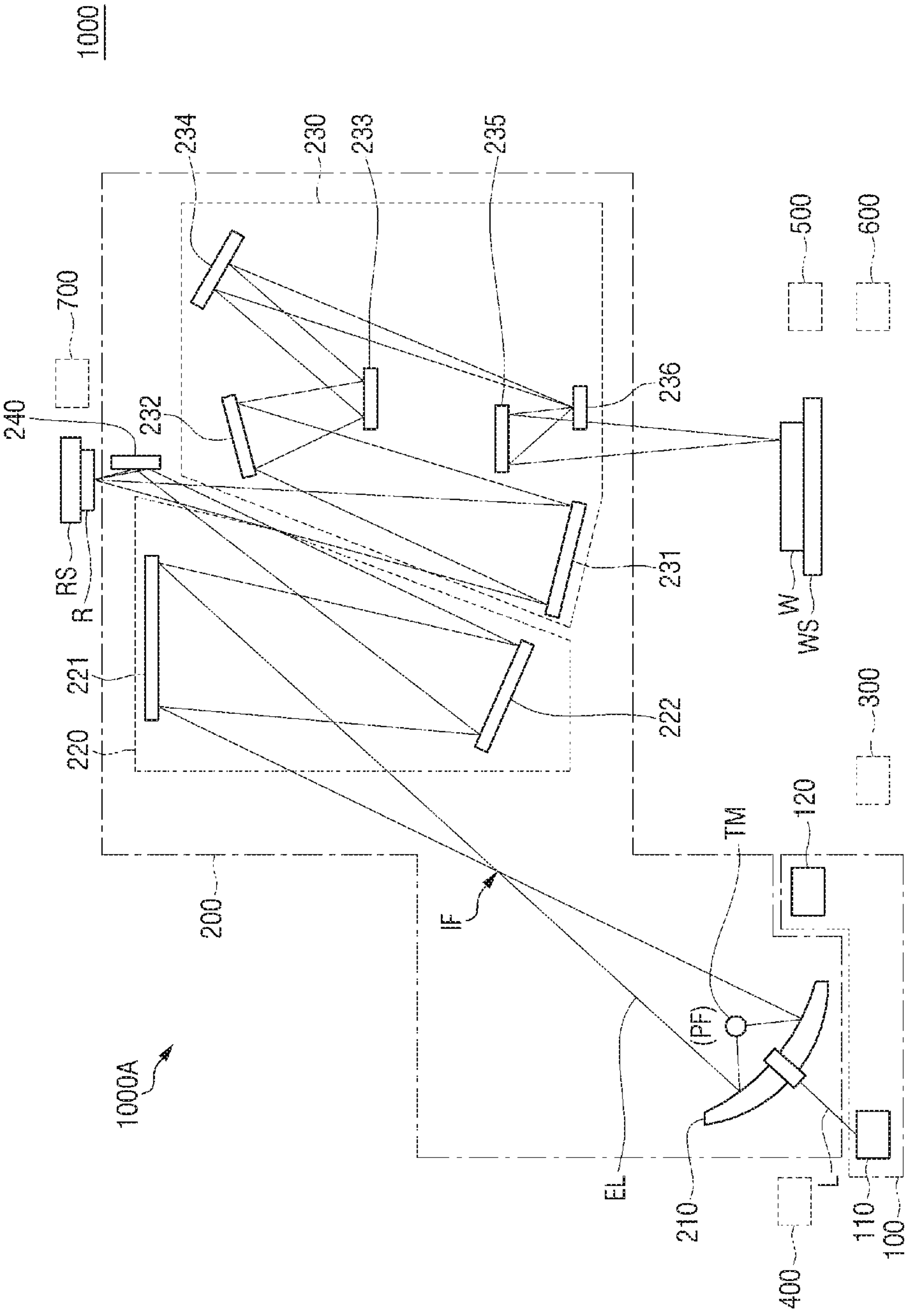
FIG. 7 is a schematic view illustrating a monitoring system for manufacturing a semiconductor device according to some example embodiments.
Figure 8:
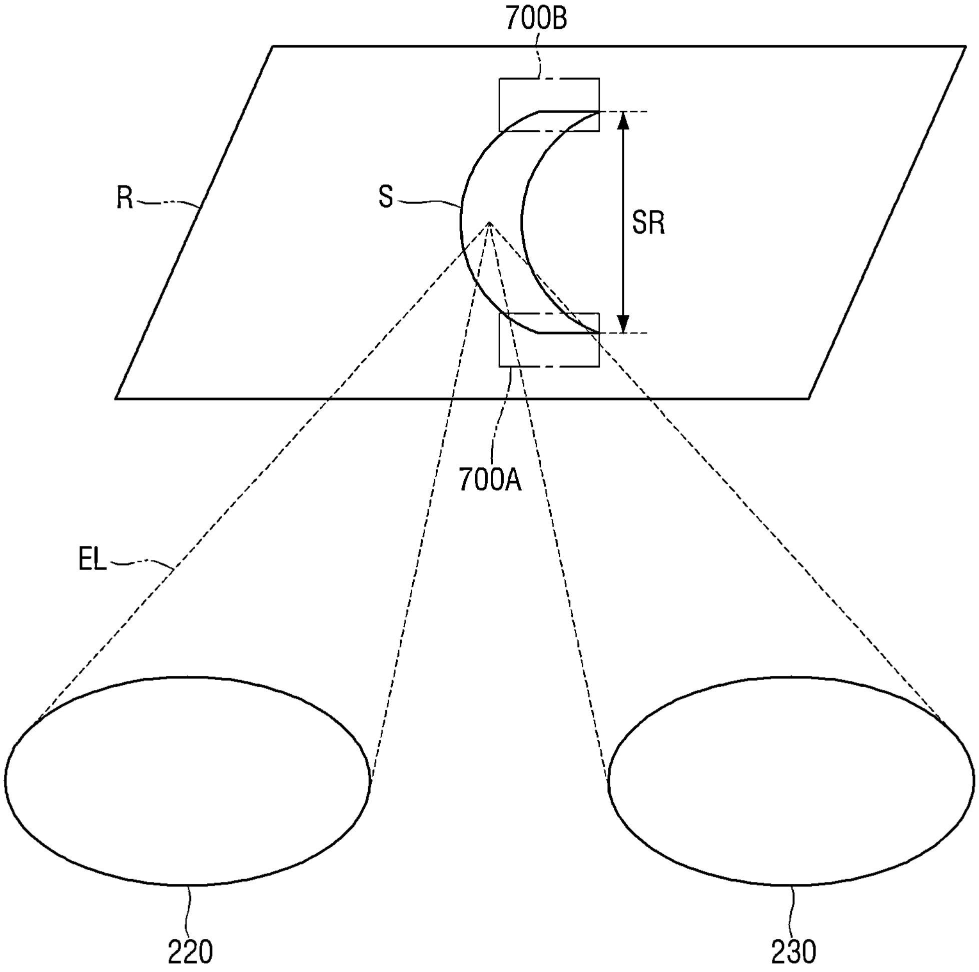
FIG. 8 is a view illustrating a fourth sensor module of FIG. 7.

FIG. 7 is a schematic view illustrating a monitoring system for manufacturing a semiconductor device according to some example embodiments. FIG. 8 is a view illustrating a fourth sensor module of FIG. 7. For convenience of description, the same description as that described with reference to FIGS. 1 to 6 may be omitted.

Referring to FIGS. 7 and 8, a monitoring system 1000 for manufacturing a semiconductor device may further include a fourth sensor module 700.

The fourth sensor module 700 may be disposed to be adjacent to the reticle R, and may measure the intensity of the extreme ultraviolet light EL incident on the reticle R in the form of a slit S. The fourth sensor module 700 may include (4A)th and (4B)th sensor modules 700A and 700B disposed to be adjacent to both ends of the reticle stage RS, respectively.

In this case, the shape of the slit S may be a shape (e.g., arc shape) of each mirror constituting the pupil facet mirror 221.

Meanwhile, the position of the fourth sensor module 700 shown in FIGS. 7 and 8 is an example and is not limited to the shown example.

The intensity RES, of the extreme ultraviolet light EL of at least a partial region (at least a partial region of SR) of the slit S may be measured by the fourth sensor module 700. The intensity RTotal of the extreme ultraviolet light EL of the entire region SR of the slit S may be calculated by the calculation module 600 from the intensity RES, of the extreme ultraviolet light EL of at least a partial region (at least a partial region of the SR) of the slit S.

At the (N)th time point, a ratio bN of the intensity RTotal,N of the extreme ultraviolet light EL of the entire region of the slit S and the intensity RES,N of the extreme ultraviolet light EL of the partial region of the slit S may be defined as expressed in Equation 9. In the Equation 9, each of the intensity RTotal,N of the extreme ultraviolet light EL of the entire region of the slit S and the intensity RES,N of the extreme ultraviolet light EL of the partial region of the slit S may refer to the intensity of the far field image of the extreme ultraviolet light EL, which is measured by the first sensor module 300. In this case, the intensity RES,N of the extreme ultraviolet light EL of the partial region of the slit S is not necessarily limited to being measured at the end of the reticle R, and may be measured in a region adjacent to the end of the reticle R.

$$b_N = \frac{R_{Total,N}}{R_{ES,N}} \quad \text{Equation 9}$$

In addition, at the (N)th time point, a relation between the intensity PES,N of the extreme ultraviolet light EL of the partial region of the slit S, which is measured by the fourth sensor module 700, and the intensity Ptotal,N of the extreme ultraviolet light EL of the entire region SR of the slit S may be defined as expressed in Equation 10.

$$P_{Total,N} = b_N \times P_{ES,N} \quad \text{Equation 10}$$

$$\text{REFLECT}_{[CLT+FFM+PFM]} = \frac{EUV\ \text{Power at Reticle Level}\ (P_{Total,N})}{EUV\ \text{Power at Source Vessel}} \quad \text{Equation 11}$$

Referring to the Equation 11, a sum REFLECT[CLT+FFM+PFM] of the reflectivity of the collector 210, the field facet mirror 221 and the pupil facet mirror 222 may be calculated by the calculation module 600 through a ratio of the intensity (EUV Power at Source Vessel) of the extreme ultraviolet light EL, which is measured by the second sensor module 400, and the intensity Ptotal,N of the total extreme ultraviolet light EL. The sum REFLECT[CLT+FFM+PFM] of the reflectivity of the collector 210, the field facet mirror 221 and the pupil facet mirror 222 does not necessarily mean absolute reflectivity.

$$RR_{[CLT+FFM+PFM],N} = \frac{\text{REFLECT}_{[CLT+FFM+PFM],N}}{\text{REFLECT}_{[CLT+FFM+PFM],0}} \quad \text{Equation 12}$$

Therefore, a sum REFLECT[CLT+FFM+PFM],N of the relative reflectivity of the collector 210, the field facet mirror 221 and the pupil facet mirror 222 immediately after the (N)th replacement of the collector 210 may be calculated by the calculation module 600. In addition, a sum REFLECT [CLT+FFM+PFM],0 of the relative reflectivity of the collector 210, the field facet mirror 221 and the pupil facet mirror 222 during the initial installation of the extreme ultraviolet light exposure apparatus 1000A may be calculated by the calculation module 600.

Subsequently, the sum REFLECT[CLT+FFM+PFM],N of the relative reflectivity of the collector 210, the field facet mirror 221 and the pupil facet mirror 222 immediately after the (N)th replacement of the collector 210 compared with the initial installation of the extreme ultraviolet light exposure apparatus 1000A may be calculated by the calculation module 600.

Therefore, the degradation rate RRPFM,N of the pupil facet mirror 222 may be calculated by the calculation module 600 as expressed in Equation 13 from the sum RR[CLT+FFM+PFM],N of the relative reflectivity of the collector 210, the field facet mirror 221 and the pupil facet mirror 222, which is calculated by the Equation 12, and the relative reflectivity RR[CLT+FFM],N of the field facet mirror 221 and collector 210, which is calculated by the Equation 6.

$$RR_{PFM,N} = \frac{RR_{[CLT+FFM+PFM],N}}{RR_{[CLT+FFM],N}} \quad \text{Equation 13}$$

Also, the degradation rate RRPFM,N of the projection optical system 230 may be calculated by the calculation module 600 as expressed in Equation 14 from the relative reflectivity RR[PFM+PO],N of the pupil facet mirror 222 and the projection optical system 230, which is calculated by the Equation 8, and the degradation rate RRPFM,N of the pupil facet mirror 222, which is calculated by the Equation 13.

$$RR_{PO,N} = \frac{RR_{[PFM+PO],N}}{RR_{[PFM],N}} \quad \text{Equation 14}$$

In this case, the degradation rate RRPFM,N of the pupil facet mirror 222 may be represented by the relative reflectivity RRPFM,N of the pupil facet mirror 222 immediately after the (N)th replacement of the collector 210 compared with the initial installation of the extreme ultraviolet light exposure apparatus 1000A. The degradation rate RRPO,N of the projection optical system 230 may be represented by the relative reflectivity RRPO,N of the projection optical system 230 immediately after the (N)th replacement of the collector 210 compared with the initial installation of the extreme ultraviolet light exposure apparatus 1000A.

Therefore, the degradation rate RRPFM,N of the pupil facet mirror 222 and the degradation rate RRPO,N of the projection optical system 230 may be separately calculated.

Figure 9:
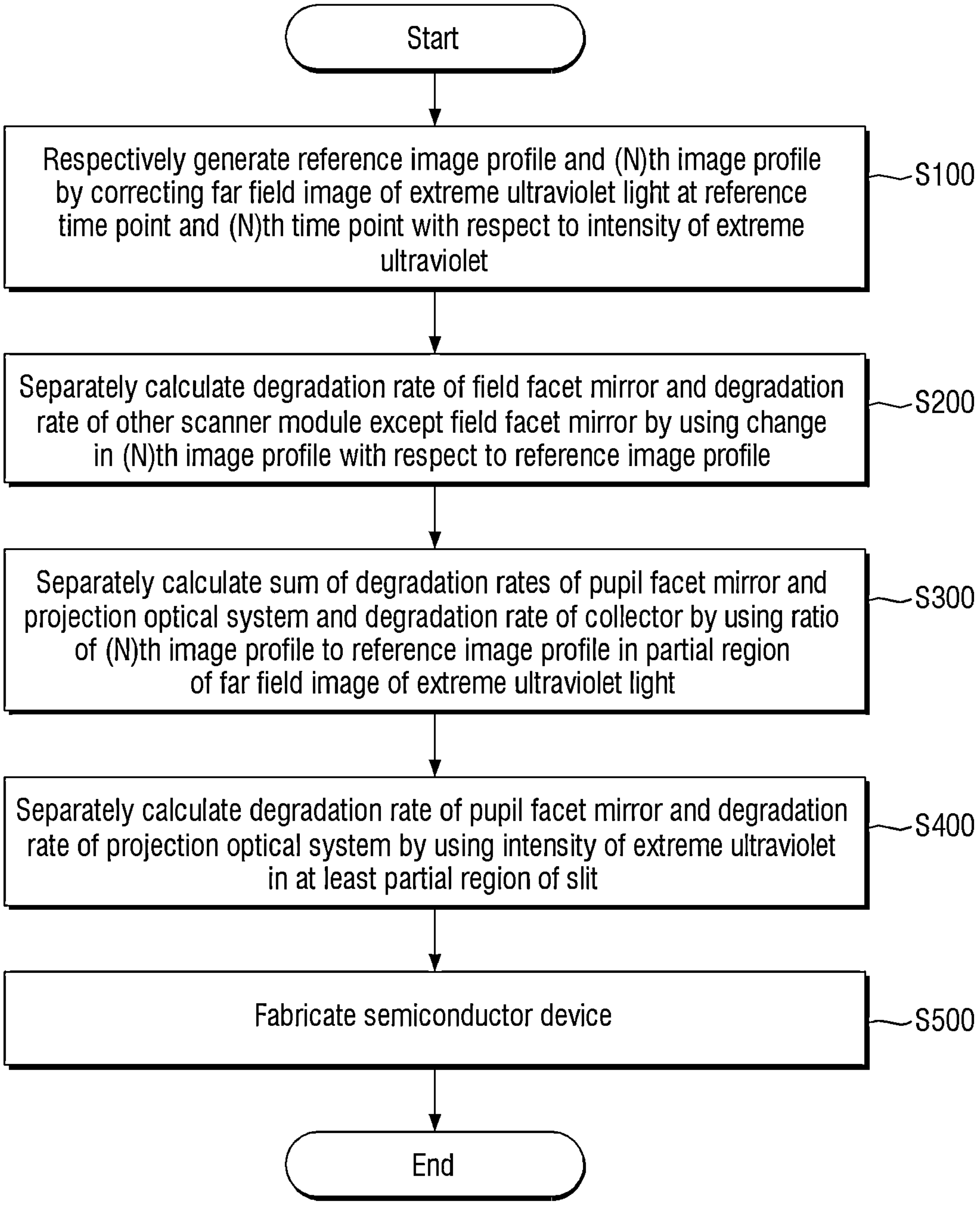
FIG. 9 is a flow chart illustrating a monitoring method for manufacturing a semiconductor device using a monitoring system for manufacturing a semiconductor device according to some example embodiments.

FIG. 9 is a flow chart illustrating a method for manufacturing a semiconductor device using a monitoring system for manufacturing a semiconductor device according to some example embodiments.

A method for manufacturing a semiconductor device according to various example embodiments will be described with reference to FIG. 9. For convenience of description, the same description as that described with reference to FIGS. 1 to 8 may be omitted.

The far field image of the extreme ultraviolet light EL light at the reference time point and the (N)th time point is corrected by the third sensor module 500 with respect to the intensity of the extreme ultraviolet light EL light so that a reference image profile RG and an (N)th image profile RN may be respectively generated (S100).

As described above, the reference time point may refer to the initial installation time point of the extreme ultraviolet light exposure apparatus 1000A, and the (N)th time point may refer to the time point immediately after the (N)th replacement of the collector 210.

Each of the reference image profile RG and the (N)th image profile RN may mean that the far field image of the extreme ultraviolet light EL is corrected (normalized) by the parameter related to the intensity of the extreme ultraviolet light EL at the reference time point and the (N)th time point.

Afterwards, the degradation rate of the field facet mirror 221 and the degradation rate of the other scanner module 200 except the field facet mirror 221 may be separately calculated by the calculation module 600 by using the change in the (N)th image profile RN with respect to the reference image profile RG (S200). In some example embodiments, the scanner module 200 may mean the optical module 200 described with reference to FIGS. 1 to 8.

In more detail, the ratio of the (N)th image profile RN to the reference image profile RG of the middle region MR among the far field images of the extreme ultraviolet light EL is extrapolated by the calculation module 600 so that a limit region of the far field image of the extreme ultraviolet light EL, in which the degradation rate of the field facet mirror 221 is minimized, may be predicted. Then, the degradation rate of the field facet mirror 221 and the sum of the degradation rates of the collector 210, the pupil facet mirror 222 and the projection optical system 230 may be separately calculated.

Afterwards, the sum of the degradation rates of the pupil facet mirror 222 and the projection optical system 230 and the degradation rate of the collector 210 may be separately calculated by the calculation module 600 by using a ratio of the (N)th image profile RN to the reference image profile RG of a partial region of the far field image of the extreme ultraviolet light EL light (S300).

In more detail, the (N)th image profile RN may be offset-corrected based on the middle-edge region rmid-edge among the far field images of the extreme ultraviolet light EL light so that the (N')th image profile RN' may be generated.

Therefore, the sum of the degradation rates of the collector 210 and the field facet mirror 221 may be calculated by the calculation module 600 by using a ratio of an area of the (N')th image profile RN' to an area of the reference image profile RG. The degradation rate of the collector 210 may be separately calculated through the degradation rate of the field facet mirror 221, which is already calculated.

Afterwards, the degradation rate of the pupil facet mirror 222 and the degradation rate of the projection optical system 230 may be separately calculated by using the intensity of the extreme ultraviolet light EL of at least a partial region (at least a partial region of SR of FIG. 8) of the slit S (S400).

In more detail, the intensity RTotal of the extreme ultraviolet light EL of the entire region SR of the slit S may be predicted from the intensity RES, of the extreme ultraviolet light EL of at least a partial region of the slit S so that the sum of the degradation rates of the collector 210, the field facet mirror 221 and the pupil facet mirror 222 may be calculated by the calculation module 600.

The degradation rate of the pupil facet mirror 222 and the degradation rate of the projection optical system 230 may be separately calculated through the degradation rate of the field facet mirror 221 and the degradation rate of the collector 210, which are already calculated.

Afterwards, a semiconductor device may be fabricated, e.g., a semiconductor device may be fabricated based on the calculated degradation rate (S500).

Although various example embodiments have been described with reference to the accompanying drawings, it will be apparent to those of ordinary skill in the art that certain features can be manufactured in various forms without being limited to described example embodiments and can be embodied in other specific forms without departing from the technical spirits and/or essential characteristics. Thus, example embodiments are to be considered in all respects as illustrative and not restrictive.

What is claimed is:

1. A method for manufacturing a semiconductor device using a monitoring system for manufacturing the semiconductor device, the monitoring system comprising, a source module configured to generate extreme ultraviolet light, an optical module configured to transfer a pattern to a substrate by using the extreme ultraviolet light, the optical module including a collector configured to collect and reflect the extreme ultraviolet light generated from the source module, the optical module including an illumination optical system including a field facet mirror configured to condense the reflected extreme ultraviolet light and a pupil facet mirror configured to transfer the extreme ultraviolet light transferred from the field facet mirror to a reticle, and a projection optical system configured to project the extreme ultraviolet reflected from the reticle to the substrate, a first sensor module configured to measure a far field image of the extreme ultraviolet from the optical module, a second sensor module adjacent to the substrate, measuring intensity of the extreme ultraviolet, and a calculation module configured to calculate a degradation rate of the optical module, the method comprising:

respectively generating a reference image profile and an (N)th image profile through the second sensor module by correcting the far field image of the extreme ultraviolet light with respect to the intensity of the extreme ultraviolet at a reference time point and an (N)th time point after the reference time point; and calculating the degradation rate of the optical module by the calculation module by using a ratio based on the reference image profile and the (N)th image profile.

2. The method of claim 1, wherein the monitoring system further comprises a third sensor module disposed to be adjacent to the source module, measuring the intensity of the extreme ultraviolet light, the method further comprising:

calculating reflectivity of the optical module by the calculation module by using a ratio of the intensity of the extreme ultraviolet light measured by the second sensor module, and the intensity of the extreme ultraviolet light measured by the third sensor module.

3. The method of claim 1, further comprising, by the calculation module:

predicting a limit region of the far field image of the extreme ultraviolet in which a degradation rate of the field facet mirror is reduced; and calculating a sum of degradation rates of the collector, the pupil facet mirror, and the projection optical system.

4. The method of claim 3, further comprising:

calculating the degradation rate of the field facet mirror by the calculation module by using a ratio based on the degradation rate of the optical module and the sum of the degradation rates of the collector, the pupil facet mirror, and the projection optical system.

5. The method of claim 1, further comprising:

calculating a sum of degradation rates of the collector and the field facet mirror by the calculation module by using a ratio of an area of the reference image profile to an area of an (N')th image profile in which the (N)th image profile is offset-corrected.

6. The method of claim 5, further comprising: calculating the degradation rate of the collector by the calculation module.

7. The method of claim 6, further comprising:

calculating a sum of degradation rates of the pupil facet mirror and the projection optical system.

8. The method of claim 1, wherein the monitoring system further comprises a fourth sensor module adjacent to the reticle, the fourth sensor module configured to measure the intensity of the extreme ultraviolet light incident on the reticle in the form of a slit, the method further comprising:

calculating the intensity of the extreme ultraviolet light of an entire region of the slit from the intensity of the extreme ultraviolet light of at least a partial region of the slit by the calculation module.

9. The method of claim 8, further comprising:

calculating a sum of degradation rates of the collector, the field facet mirror and the pupil facet mirror from the intensity of the extreme ultraviolet of the entire region of the slit by the calculation module.

10. The method of claim 9, further comprising:

calculating the degradation rate of the pupil facet mirror by the calculation module.

11. The method of claim 9, further comprising:

calculating a degradation rate of the projection optical system by the calculation module.

12. A method for manufacturing a semiconductor device using a system for manufacturing the semiconductor device, the system comprising, a source module configured to generate extreme ultraviolet light;

an optical module configured to transfer a pattern to a substrate by using the extreme ultraviolet light, the optical module including a collector configured to collect and reflect the extreme ultraviolet light generated from the source module, an illumination optical system including a field facet mirror configured to condense the reflected extreme ultraviolet light, the illumination optical system further including a pupil facet mirror configured to transfer the extreme ultraviolet light transferred from the field facet mirror to a reticle, and the optical module further including a projection optical system configured to transfer the extreme ultraviolet light reflected from the reticle to the substrate, a first sensor module configured to measure a far field image of the extreme ultraviolet from the optical module, a second sensor module adjacent to the source module, and configured to measure intensity of the extreme ultraviolet, a third sensor module be adjacent to the substrate, and configured to measure the intensity of the extreme ultraviolet;

a calculation module configured to calculate a degradation rate of the optical module, and a fourth sensor module adjacent to the reticle, and configured to measure the intensity of the extreme ultraviolet light incident on the reticle in the form of a slit, the method comprising:

respectively generating a reference image profile and an (N)th image profile through the second sensor module by correcting the far field image of the extreme ultraviolet light with respect to the intensity of the extreme ultraviolet light at a reference time point and an (N)th time point after the reference time point; and calculating the degradation rate of the optical module by the calculation module by using a ratio of the reference image profile to the (N)th image profile.

13. The method of claim 12, further comprising:

calculating reflectivity of the optical module by the calculation module by using a ratio of the intensity of the extreme ultraviolet light measured by the second sensor module to the intensity of the extreme ultraviolet light measured by the third sensor module.

14. The method of claim 12, further comprising:

calculating a degradation rate of the field facet mirror by the calculation module.

15. The method of claim 12, further comprising:

calculating the degradation rate of the collector by the calculation module.

16. The method of claim 12, further comprising:

calculating a degradation rate of the pupil facet mirror by the calculation module.

17. The method of claim 12, further comprising:

calculating a degradation rate of the projection optical system by the calculation module.

18. A method for manufacturing a semiconductor device using a system for manufacturing the semiconductor device, the system comprising, a source module configured to generate extreme ultraviolet light, an optical module configured to transfer a pattern to a substrate by using the extreme ultraviolet light, the optical module including a collector configured to collect and reflect the extreme ultraviolet light generated from the source module, an illumination optical system including a field facet mirror configured to condense the reflected extreme ultraviolet light and a pupil facet mirror configured to transfer the extreme ultraviolet light transferred from the field facet mirror to a reticle, and a projection optical system configured to transfer the extreme ultraviolet light reflected from the reticle to the substrate, a first sensor module configured to measure a far field image of the extreme ultraviolet from the optical module, a second sensor module adjacent to the source module and configured to measure an intensity of the extreme ultraviolet light, a third sensor module adjacent to the substrate and configured to measure the intensity of the extreme ultraviolet light, and a calculation module configured to calculate a degradation rate of the optical module, the method comprising:

respectively generating a reference image profile and an (N)th image profile through the second sensor module by correcting the far field image of the extreme ultraviolet light with respect to the intensity of the extreme ultraviolet light at a reference time point and an (N)th time point after the reference time point; and respectively calculating, by the calculation module, a degradation rate of the field facet mirror and a sum of degradation rates of the other optical modules except the field facet mirror by using a ratio based on the reference image profile and the (N)th image profile.

19. The method of claim 18, further comprising:

respectively calculating a sum of the degradation rates of the field facet mirror and the projection optical system and a degradation rate of the collector by the calculation module by using a ratio based on the reference image profile and the (N)th image profile in at least a partial region of the far field image of the extreme ultraviolet light.

20. The method of claim 18, wherein the system further comprises a fourth sensor module disposed to be adjacent to the reticle, measuring the intensity of the extreme ultraviolet incident on the reticle in the form of a slit, the method further comprising:

respectively calculating the degradation rate of the field facet mirror and the degradation rate of the projection optical system from the intensity of the extreme ultraviolet light in an entire region of the slit at the (N)th time point and the intensity of the extreme ultraviolet light, which is measured by the second sensor module.

* * * * *